United States Patent [19]
Hiroki et al.

[11] Patent Number: 5,518,944
[45] Date of Patent: May 21, 1996

[54] MOS TRANSISTOR AND ITS FABRICATING METHOD

[75] Inventors: Akira Hiroki, Osaka; Shinji Odanaka, Hirakata; Kazumi Kurimoto, Osaka, all of Japan

[73] Assignee: Matsushita Electric Industrial Co., Ltd., Osaka, Japan

[21] Appl. No.: 308,756

[22] Filed: Sep. 19, 1994

Related U.S. Application Data

[62] Division of Ser. No. 225,098, Apr. 8, 1994, Pat. No. 5,386,133.

[30] Foreign Application Priority Data

Feb. 5, 1991 [JP] Japan ................................. 3-014570

[51] Int. Cl.$^6$ ............................................. H01L 21/8234
[52] U.S. Cl. ........................... 437/44; 437/41; 437/162
[58] Field of Search ........................... 437/41, 44, 162, 437/191

[56] References Cited

U.S. PATENT DOCUMENTS

| | | | |
|---|---|---|---|
| 4,788,160 | 11/1988 | Havemann et al. | 437/44 |
| 4,837,179 | 6/1989 | Foster et al. | 437/44 |
| 4,971,922 | 2/1990 | Watabe et al. | 437/44 |
| 5,047,361 | 9/1991 | Matloubian et al. | 437/44 |
| 5,089,435 | 2/1992 | Akiyama | 437/44 |

FOREIGN PATENT DOCUMENTS 0074042  3/1990  Japan .

OTHER PUBLICATIONS

IH–Chin Chen, "Simple Gate–to–Drian Overlapped MOSFET's Using Poly Spacers for High Immunity to Channel Hot–Electron Degradation," *IEEE Electron Device Letters,* vol. 11, No. 2, pp. 78–81, Feb.

C. K. Lau et al., "A Super Self–Aligned Source/Drain MOSFET", *IEEE*, pp. 358–361, 1987.

*Primary Examiner*—Tom Thomas
*Attorney, Agent, or Firm*—Ratner & Prestia

[57] ABSTRACT

An object of the subject invention is to offer a MOS semiconductor device capable of suppressing hot carrier degradation, improving driving capabilities and also enabling miniaturization to the submicron region and smaller; and methods for its fabrication. By forming the gate electrode 5 through the medium of gate oxide film 4 on one main surface of the first conductivity type semiconductor substrate 1 between the second conductivity type low concentration diffusion layers 3, the effective channel length is made roughly equal to the gate length, and miniaturization to the submicron region and smaller is accomplished. Also, by forming the second conductivity type diffusion layer 7A on the sides of the gate electrode 5 through the medium of the thin insulating film 6 to be above the low concentration diffusion layer 3 and further contacting the low concentration diffusion layer 3, the high electrical field within the low concentration diffusion layer 3 is sufficiently ameliorated, generation of hot carriers is suppressed, and resistance to degradation is improved. Moreover, by controlling the high resistance second conductivity type diffusion layer 7A at the sides of the gate electrode 5, the source resistance is decreased and driving capabilities are improved. At the same time the contact region of the source-drain electrode is miniaturized.

3 Claims, 7 Drawing Sheets

MOS TRANSISTOR AND ITS FABRICATING METHOD

BACKGROUND OF THE INVENTION

This application is a division of application Ser. No. 08/225,098, filed Apr. 8, 1994, now U.S. Pat. No. 5,386,133.

The subject invention relates to a MOS semiconductor device with high concentration and high reliability, wherein miniaturization has been achieved, driving capabilities have been improved and furthermore resistance to hot carriers has been improved; and its fabricating method.

In ultra integrated circuit devices, so-called VSLI and MOS semiconductor devices are being miniaturized to the sub-micron region due to the demands of high integration. Accompanying this miniaturization, the degradation of electrical characteristics due to hot carriers has become a serious problem from the standpoint of reliability. As a MOS structure to improve resistance to hot carriers and moreover to improve driving capabilities, the sidewall gate structure has been proposed. For example, as proposed by I-C Chen, et al. in I.E.E.E. Electron Device Letters, Vol. 11, No. 2, February 1990, pp 78–81.

On the one hand, structures and processes have been proposed to miniaturize the source-drain electrode regions when miniaturization is advanced into the submicron region and smaller regions. For example, a SSS-MOS structure has been proposed by C. K. Lau, et al. in I.E.E.E. 1987 I.E.D.M. Technical Digest, pp 358–361.

We shall now explain this from two objectives accompanying the miniaturization of MOS semiconductor devices:

(I) Improvement of resistance to hot carrier degradation and improvement of driving capabilities, and, (II) Miniaturization of the source-drain electrode region.

(I) With regard to improvement of resistance to hot carrier degradation and improvement of driving capabilities:

As an example, the sidewall gate structure proposed by I-C Chen, et al. in I.E.E.E. Electron Device Letters, Vol. 11, No. 2, February 1990, pp 78–81, is shown in FIG. 6.

In FIG. 6, 31 is a semiconductor substrate of a first conductivity type (P type), 32 is a high concentration source-drain diffusion layer of a second conductivity type (n+type) formed on the surface of the semiconductor substrate 31, 33 is a low concentration diffusion layer of a second conductivity type (n–type) likewise formed on the surface of the semiconductor substrate 31. 34 is the gate oxide film, 35 is the gate electrode, 36 is an oxide layer formed to cover the gate electrode, and, 37 is the sidewall gate electrode.

In this type of MOS semiconductor device structure, since the sidewall gate electrode 37 is formed above the low concentration diffusion layer 33 through the medium of the gate oxide film 34, the high electrical field generated within the low concentration diffusion layer 33 is mitigated, the generation of hot carriers is suppressed and resistance to degradation is improved. Also, by controlling the potential of the high resistance low concentration diffusion layer 33 by the sidewall gate electrode 37, the accumulation of the low concentration diffusion layer 33 is promoted, the source resistance is lowered and driving capabilities are improved.

(II) With regard to miniaturization of the source-drain electrode:

As an example, FIG. 7 shows the structure proposed by C. K. Lau et al. in I.E.E.E. 1987 I.E.D.M. Technical Digest, pp 358–361.

In FIG. 7, 41 is a semiconductor substrate of a first conductivity type (p type), 42 is a high concentration diffusion layer of a second conductivity type (n+type), 43 is a low concentration diffusion layer of a second conductivity type (n–type), 44 is a gate oxide film, 45 is a gate electrode, 46 is an insulator film, 47 is a sidewall, 48 is a tungsten electrode and 49 is a field oxide film.

In this type of MOS semiconductor device structure, after forming a standard type gate electrode 45 by the 1 micron process, a 250 to 300 nm sidewall of nitride film (not shown) is formed, and the source-drain region is formed through an oxidation process at 950° C. After removing the sidewall of nitride film, the low concentration diffusion layer 43 is formed by ion implantation. After forming a 150 nm sidewall 47, ion implantation is used to form the high concentration diffusion layer 42.

However, this structure and fabrication process still does not suffice for a MOS semiconductor device for the submicron region and smaller regions. That is to say, the MOS semiconductor device shown in FIG. 6 has the following serious problems:

(1) Because the sidewall gate electrode 37 is formed above the low concentration diffusion layer 33, the effective channel length, $L_{eff}$ becomes:

$$L_{eff} > L_g - 2 \times L_s$$

Here, $L_g$ is the total gate length and $L_s$ is the length of the sidewall gate. Since the sidewall gate length $L_s$ needs to be at least 0.15 microns, it is not possible to make structures each with a gate length $L_g$ of 0.3 microns or less.

(2) Because the sidewall gate electrode 37 is formed above the low concentration diffusion layer 33, in order to obtain contacts for the source-drain electrode, a rather broad margin of contact is required, taking into account insulation vis-a-vis the sidewall gate electrode 37. Hence, miniaturizaton is difficult.

From the above points, it is extremely difficult to miniaturize the sidewall gate structure to the submicron region and less.

Also, in the MOS semiconductor device with the structure shown in FIG. 7, the following severe problems exist:

(1) With respect to the hot carrier degradation, which becomes a severe problem in micro-MOS semiconductors in the submicron region and smaller, since 150 nm insulating film sidewall 47 is formed, unlike the prior art LDD structure, the high electrical field generated within the low concentration diffusion layer 43 is not sufficiently ameliorated at the gate electrode 45, and the generation of hot carriers is not sufficiently suppressed. Also, traps and boundary levels are generated in the sidewall 47 above the low concentration diffusion layer 43, and there is severe early degradation of electrical characteristics due to hot carrier degradation.

(2) Because the insulating film sidewall 47 is formed above the low concentration diffusion layer 43, the potential of the low concentration diffusion layer 43 is not sufficiently controlled at the gate electrode 45, the accumulation of the low concentration diffusion layer 43 is not promoted, the source resistance is high and the driving capabilities are lowered.

(3) Since the source-drain regions are formed in a self aligning manner, the processes of forming and removing a nitride film sidewall are required, and additionally, in order to form the high concentration diffusion film 42, there is the added process of selectively growing a monocrystalline silicon film epitaxially and, the fabrication process itself becomes complex.

SUMMARY OF THE INVENTION

An object of the subject invention is to offer a MOS semiconductor device and its fabrication method, the MOS semiconductor device being capable of suppressing hot carrier degradation, while improving driving capabilities, and, making possible miniaturization to the submicron region and smaller.

The MOS semiconductor device of the subject invention has a high concentration source-drain diffusion layer of a second conductivity type formed on one main surface of a first conductivity type semiconductor substrate. A low concentration diffusion layer of a second conductivity type is also formed on a main surface of the semiconductor substrate. This second conductivity type low concentration diffusion layer is in contact with a main surface of the semiconductor substrate between the high concentration source-drain diffusion layer and also is in contact with the sidewalls of the high concentration source-drain diffusion layer.

A gate electrode is formed on a main surface between the low concentration diffusion layers through the medium of the gate insulating film, and a thin insulating film is formed on the sides of the gate electrode. Also, a second conductivity type diffusion layer is formed on the sides Of the gate electrode via the medium of the thin insulating film in such a manner as to be above the low concentration diffusion layer and to be in contact with the low concentration diffusion layer.

The MOS semiconductor device of claim 2 has formed on it a second conductivity type diffusion layer with a low concentration.

The fabrication method of the MOS semiconductor device of claim 3 consists of first forming a gate insulating film on a main surface of a first conductivity type semiconductor substrate, then selectively forming a gate electrode above this gate insulating film, and, ion implanting the surface of the semiconductor substrate using the gate electrode as a mask to form a second conductivity type low concentration diffusion layer.

Then, the surface of the semiconductor substrate is oxidized. Next, the oxide film formed on the surface of the semiconductor substrate is dry etched to remove the oxide film from other than the top surface and the sidewalls of the gate electrode. A polycrystalline silicon film is then overlayed over the semiconductor substrate surface with oxide film retained on the top surface and sidewalls of the gate electrode.

Next, this polycrystalline silicon film is dry etched, leaving the polycrystalline silicon layer to cover the sidewalls of the gate electrode in a self-aligning manner.

Then, by ion implanting a dopant of a second conductivity type in the surface of the semiconductor substrate, a second conductivity type dopant is diffused into the remaining polycrystalline silicon film on the sidewalls of the gate electrode via the medium of the thin oxide film to create a second conductivity type diffusion layer on the sidewalls of the gate electrode. At the same time a high concentration source-drain diffusion layer is formed on one main surface of the semiconductor substrate to the outside of the low concentration diffusion layer.

The fabrication method of the MOS semiconductor device in claim 4 consists of first forming a gate insulating film on one main surface of the first conductivity type semiconductor substrate, selectively forming the gate electrode above this gate insulating film, and, forming the second conductivity type low concentration diffusion layer by ion implantation of the semiconductor substrate surface using the gate electrode as the mask.

Then, an insulating film is overlayed over the surface of the semiconductor substrate. Next, the insulating film formed over the surface of the semiconductor substrate is dry etched to remove the insulating film from other than over the gate electrode and its sidewalls. A polycrystalline silicon film is overlayed over the surface of the semiconductor substrate with insulating film remaining over the gate electrode and its sidewalls.

This polycrystalline silicon film is then dry etched to leave polycrystalline silicon film covering the sidewalls of the gate electrode in a self-aligning manner.

Next, by ion implanting a second conductivity type dopant in the surface of the semiconductor substrate a second conductivity type dopant is diffused into the remaining polycrystalline silicon film to the sides of the gate electrode through the medium of the thin insulating film to form a second conductivity type diffusion layer on the sides of the gate electrode. In addition, a high concentration source-drain diffusion layer is also formed on a main surface of the semiconductor substrate outside the low concentration diffusion layer.

The fabrication method of the MOS semiconductor device of claim 5 consists of first forming a high concentration first polycrystalline silicon film on one main surface of the first conductivity type semiconductor substrate through the medium of the gate oxide film. Then, a second conductivity type low concentration diffusion layer is formed on the surface of the semiconductor substrate using this high concentration first polycrystalline silicon film as a mask. Next, a second insulating film is formed on the surface of the semiconductor substrate. This second insulating film is dry etched to leave the second insulating film to cover only the sides of the gate electrode and the first polycrystalline silicon film.

Next, a second polycrystalline silicon film is overlayed on the surface of the semiconductor substrate and heat treated to diffuse dopant from the first polycrystalline silicon film to the second polycrystalline silicon film. Dry etching is then conducted for the first polycrystalline silicon film and the second polycrystalline silicon film to leave the second polycrystalline silicon film on the sidewalls of the gate electrode via the medium of the second oxide film.

Then, by ion implantation of a second conductivity type dopant into the surface of the semiconductor substrate, a second conductivity type dopant is diffused into the polycrystalline silicon film remaining on the sides of the gate electrode to form a second conductivity type diffusion layer on the sides of the gate electrode. In addition, a high concentration source-drain diffusion layer is formed on one main surface of the semiconductor substrate on the outside of the low concentration diffusion layer.

According to the MOS semiconductor device of the subject invention, by forming the gate electrode via the medium of the gate oxide film on a main surface of the first conductivity type semiconductor substrate between the second conductivity type low concentration diffusion layers, the effective channel length will be roughly equal to the length of the gate, and it becomes possible to miniaturize to a sub-micron region or less. Also, by forming at the sides of the gate electrode via the medium of the thin insulating film a second conductivity type diffusion layer to be above the low concentration diffusion layer and further contacting this low concentration diffusion layer, the high electrical field within the low concentration diffusion layer is sufficiently ameliorated, generation of hot carriers is suppressed and resistance to degradation is improved.

Also, by forming a second conductivity type diffusion layer at the sides of the gate electrode through the medium of the thin insulating film to control the high resistance second conductivity type diffusion layer at the gate electrode's sides, the source resistance is reduced and driving capability is improved. Further, by forming a second conductivity type diffusion layer above the low concentration diffusion layer, it is also possible to miniaturize the contact region of the drain electrode.

In particular, due to the forming of the second conductivity type diffusion layer with low concentration, the voltage applied to the insulating film existing between the gate electrode and the second conductivity type diffusion layer is reduced and reliability is increased even further. On the one hand, according to the subject invention's MOS semiconductor device fabricating method, by ion implanting the dopant for forming the second conductivity type low concentration diffusion layer using the gate electrode as the mask, the effective channel length and the length of the gate will have roughly the same length, making possible the miniaturization to the sub-micron region or less and making it possible to form high density VSLI.

Also, since the second conductivity type diffusion layer is self-aligningly formed on the sidewalls of the gate electrode via the medium of the thin insulating film, it is possible to fix the junction position of the second conductivity type diffusion layer and the high concentration source-drain diffusion layer, as well as the amount of overlap between the second conductivity type diffusion layer and the low concentration diffusion layer. Moreover, during the dopant ion implantation process for forming the second conductivity type diffusion layer for the gate electrode's sides, at the same time as forming the second conductivity type diffusion layer it is possible to effectively destroy the oxide film formed between the low concentration diffusion layer and the second conductivity type diffusion layer.

Again, since the second conductivity type diffusion layer contacting the low concentration diffusion layer is formed at the sides of the gate electrode via the medium of the insulating film, it is easy to obtain contacts for the source-drain electrodes, it is possible to miniaturize the source-drain region and a high density VLSI can be formed.

In particular, by forming the insulating film by overlaying it is possible to form highly voltage resistant insulating films.

DETAILED DESCRIPTION OF THE INVENTION

A first embodiment of a MOS semiconductor device of the subject invention will be explained using the figures.

Figure 1:
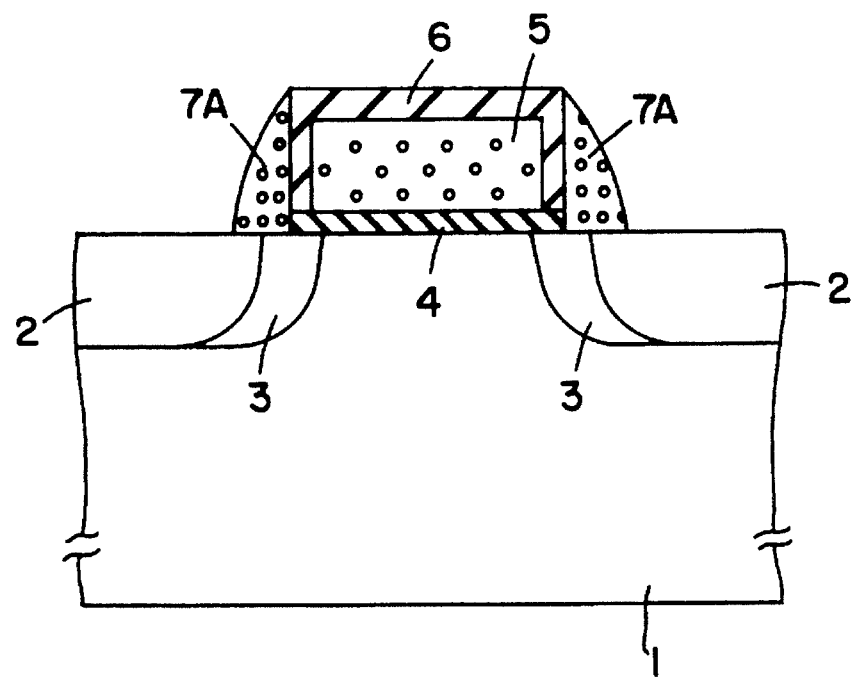
FIG. 1 is a cross-section of a first embodiment of a MOS semiconductor device of the subject invention.

FIG. 1 is a cross-section of the first embodiment of a MOS semiconductor device of the subject invention. In FIG. 1, 1 is a first conductivity type semiconductor substrate (p type). 2 is a second conductivity type high concentration source-drain diffusion layer (n+type) formed on one main surface of the semiconductor substrate 1. 3 is a second conductivity type low concentration diffusion layer (n–type) formed on a main surface of the semiconductor substrate 1 to contact one main surface of the semiconductor substrate 1 between the high concentration source-drain diffusion layer 2 and to contact the sidewalls of the source-drain diffusion layer. 4 is the gate oxide film formed on one main surface of the semiconductor substrate 1. 5 is the gate electrode formed above the gate oxide film 4. 6 is the insulating film formed above and on the sidewalls of the said gate electrode 5, and it is thin on the sides of the gate electrode 5. 7A is a second conductivity type diffusion layer (n type) formed on the sides of the gate electrode 5 via the medium of the thin insulating film 6 so as to be above the low concentration diffusion layer 3 and contacting the low concentration diffusion layer 3.

One of the characteristics of the MOS semiconductor device of FIG. 1 is that it is formed so that the intrusion of the low concentration diffusion layer 3 below the gate electrode 5 from thermal diffusion will be an extremely small amount. Accordingly, the effective channel length will be roughly equal to the length of the gate. Thus, it becomes possible to miniaturize to the sub-micron region or smaller.

Also, another characteristic of the MOS semiconductor device of FIG. 1 is that a second conductivity type diffusion layer 7 is formed on the sides of the gate electrode 5 through the medium of the thin insulating film 6. Because of this, it is possible to easily control the potential of the diffusion layer 7 at the gate electrode 5, promoting the accumulation of the diffusion layer 7, effectively lowering the source resistance, and achieving improved driving capabilities.

Further, the second conductivity type diffusion layer 7 is formed, via the medium of the thin insulating film 6, on the sides of the gate electrode 5, and, above the low concentration diffusion layer 3. Hence, the high electrical field generated within the diffusion layer 7 is ameliorated and the generation of hot carriers is suppressed. Thus, improvement in resistance to hot carrier degradation is accomplished.

Moreover, since the diffusion layer 7, contacting the low concentration diffusion layer 3, is formed on the sidewalls of the gate electrode 5 via the medium of the thin insulating film 6, the contacts for the source-drain electrodes can be obtained with minute margins, thus enabling the miniaturization of the source-drain region.

As noted above, in accordance with the subject embodiment, it becomes possible to improve driving capabilities and enable miniaturization to the sub-micron region or smaller, while suppressing hot carrier degradation in MOS semiconductor devices.

The second embodiment of the MOS semiconductor device of the subject invention will be explained referring to the figures.

Figure 2:
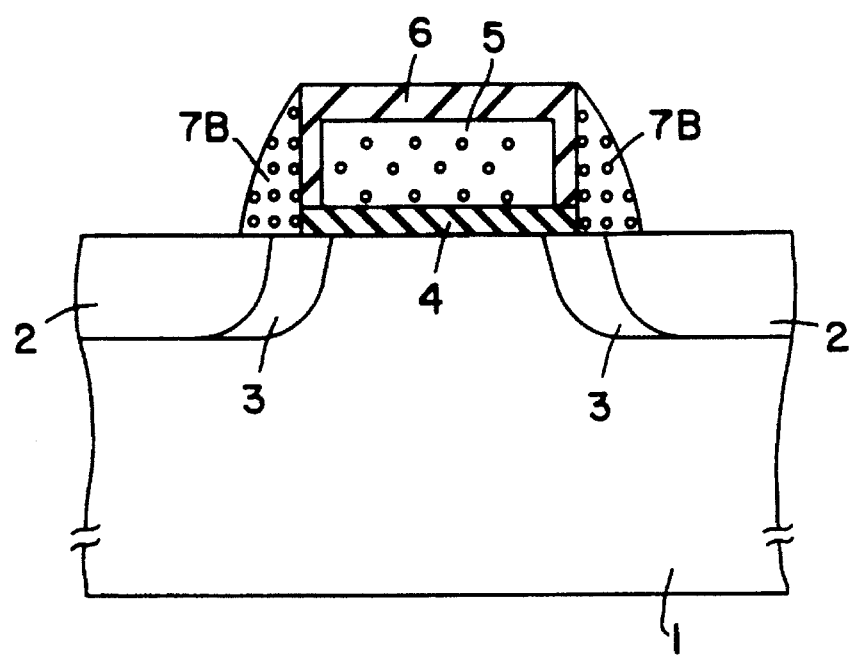
FIG. 2 is a cross-section of a second embodiment of a MOS semiconductor device of the subject invention.

FIG. 2 is a cross-section of a second embodiment of the MOS semiconductor device of the subject invention.

In FIG. 2, 1 is the first conductivity type semiconductor substrate (p type). 2 is the second conductivity type high concentration source-drain diffusion layer (n+type) formed on one main surface of the semiconductor substrate 1. 3 is the second conductivity type low concentration diffusion layer (n– type) on one main surface of the semiconductor substrate 1 in such a manner as to contact one main surface of the semiconductor substrate 1 between the high concentration source-drain diffusion layer 2, and to contact the sidewalls of the source-drain diffusion layer. 4 is the gate oxide film formed on one main surface of the semiconductor substrate 1. 5 is the gate electrode formed over the gate oxide film 4. 6 is the insulating film formed on the top and sidewalls of the said gate electrode 5, and is thin at the sides of the gate electrode 5. 7B is a second conductivity type low concentration diffusion layer (n–type) formed on the sides of the gate electrode 5, via the medium on the thin insulating film 6, to be above the low concentration diffusion layer 3 and contacting the low concentration diffusion layer 3.

The difference from the embodiment in FIG. 1 is that the second conductivity type diffusion layer 7B is formed with low concentration. Because of this, in comparison with a structure as in FIG. 1 where the diffusion layer 7A has high concentration, the voltage applied to the insulating film 6 can be reduced. Thus a MOS semiconductor device with high reliability can be obtained. Moreover, in the same manner as in FIG. 1, improvement of driving capabilities, improvement in resistance to hot carrier degradation, and miniaturization are achieved.

Next, with regard to a first embodiment of the MOS semiconductor device fabrication method to manufacture the above-noted MOS semiconductor device, the key points will be explained with reference to the figures.

FIG. 3A–3D are process cross-sections showing a first embodiment of the fabrication method for the MOS semiconductor device of the subject invention. In FIG. 3A–3D, 1 is the first conductivity type semiconductor substrate (p type), 2 is the second conductivity type high concentration source-drain diffusion layer (n+ type), 3 is the second conductivity type low concentration diffusion layer (n–type), 4 is the gate oxide film, 5 is the gate electrode, 6 is the insulating film formed through oxidation, 7 is polycrystalline silicon, and, 7A is the second conductivity type diffusion layer (n type).

Figure 3A:
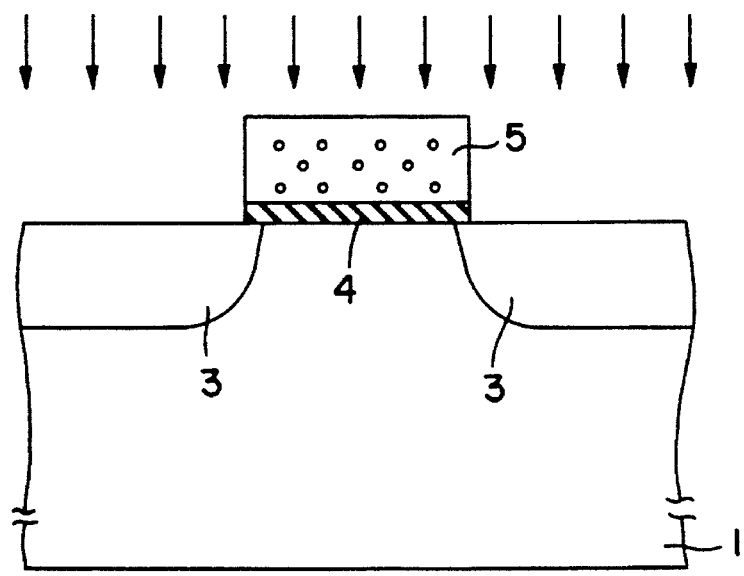
FIG. 3A–3D are process cross-sections of a first embodiment of a MOS semiconductor device fabricating method of this invention.

First, as shown in FIG. 3A, using as the mask gate electrode 5 formed by polycrystalline silicon via the medium of gate oxide film 4, phosphorus, which is the dopant for forming the second conductivity type low concentration diffusion layer 3 (n–type) on the first conductivity type semiconductor substrate (p type) 1, is ion implanted with an accelerating voltage of 40 kev and a dosage of $1.0\times10^{13}$/cm$^2$. At this time, since the ion implantation is conducted using gate electrode 5 as the mask, the penetration by the low concentration diffusion layer 3 below the gate electrode 5 is extremely small, and, the effective channel length and the length of the gate become roughly equal.

Figure 3B:
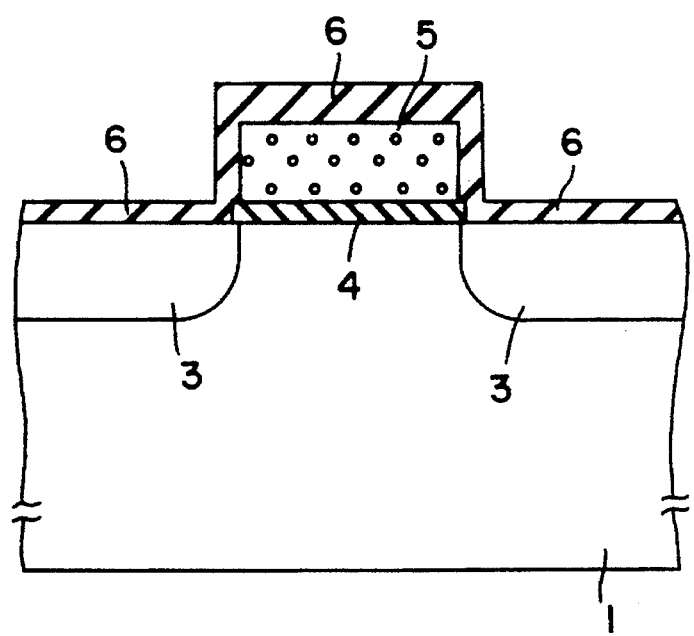

Next, as shown in FIG. 3B, insulating film 6 is formed on the surface of the semiconductor substrate 1 and on the sidewalls of and over the gate electrode 5 through thermal oxidation. At this time, since the gate electrode 5 is doped to a high concentration, the insulating film 6 is formed thicker on the sidewalls of and over the gate electrode than on the surface of the semiconductor substrate 1.

Figure 3C:
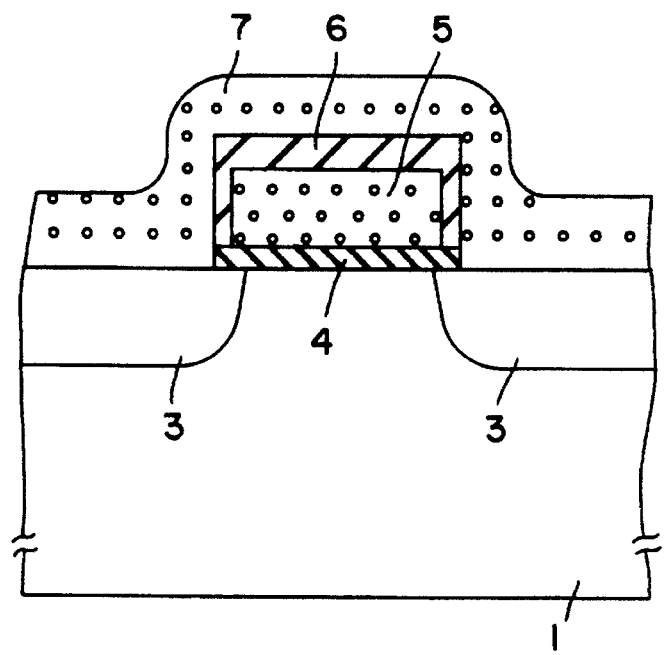

Subsequently, as shown in FIG. 3C, the insulating film 6 is dry etched to remove the insulating film 6 from elsewhere than above the gate electrode 5 and on the sidewalls of the gate electrode 5, and leaving a thin insulating film 6 to cover the sidewalls of the gate electrode 5 and over it. Next, polycrystalline silicon 7 is overlayed over the entire surface of the semiconductor substrate 1.

Figure 3D:
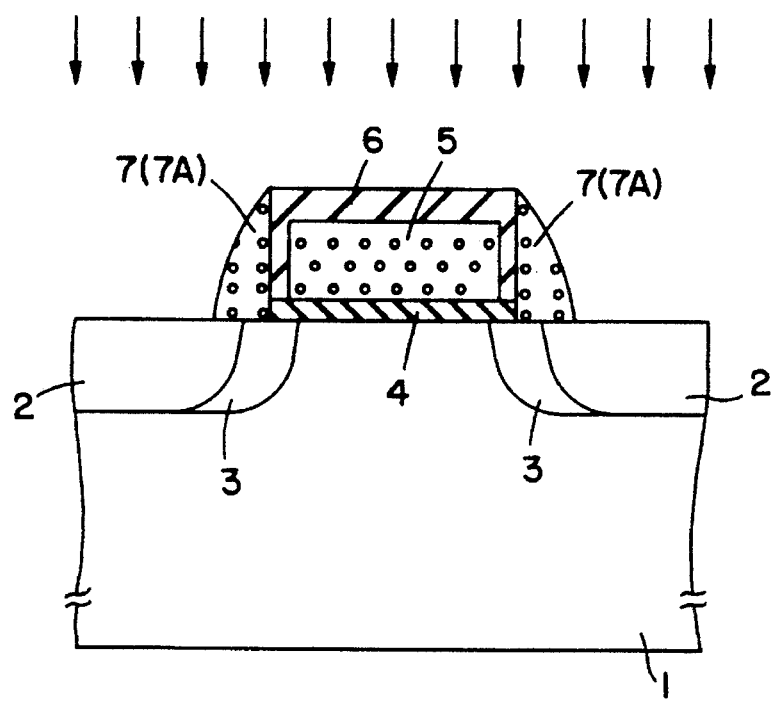

Then, as shown in FIG. 3D, polycrystalline silicon is etched to leave a covering over the sidewalls of the gate electrode 5. Using the gate electrode 5 and the remaining polycrystalline silicon 7 as a mask, Arsenic which is the dopant for forming the high concentration source-drain diffusion layer 2 is ion implanted into the semiconductor substrate 1 with acceleration voltage of 80 kev and dosage of $6.0\times10^{15}$/cm$^2$. The MOS semiconductor device is then obtained by thermal treatment to diffuse the dopant to form the high concentration source-drain diffusion layer 2, and making the polycrystalline silicon 7 the second conductivity type diffusion layer 7a (n type).

At this time, the natural oxide film existing between the polycrystalline silicon 7 and the semiconductor substrate 1 is destroyed by ion implantation and the low concentration diffusion layer 3 and the diffusion layer 7A are electrically connected. Also, since the polycrystalline silicon 7 on both sides of the gate electrode 5 is formed self-aligningly, the contact location between the high concentration source-drain diffusion layer 2 and the diffusion layer 7A, as well as the amount of overlap between the diffusion layer 7A and the low concentration diffusion layer 3 can be fixed.

As above, in accordance with this embodiment, a MOS semiconductor device with an effective channel length and a length of the gate being roughly equal can be readily obtained, and it is possible to miniaturize to the submicron region or less. Moreover, since for the gate electrode 5 the insulating film (insulating film 6) between its sidewall polycrystalline silicon 7 is formed by thermal oxidation, the thin insulating film 6 can be obtained easily, from the standpoint of processing, and with high accuracy. Also, because the polycrystalline silicon 7 on both sides of the gate electrode 5 is formed self-aligningly, the contact positions between the high concentration diffusion layer 2 and the diffusion layer 7, and, the amount of overlap between the diffusion layer 7 and the low concentration diffusion layer 3 can be fixed, so that a MOS semiconductor device can be obtained with extremely high accuracy and with high density.

Next, with regard to a second embodiment of the MOS Semiconductor device fabrication method for manufacturing the MOS semiconductor device, key points will be explained with reference to the figures.

Figure 4A:
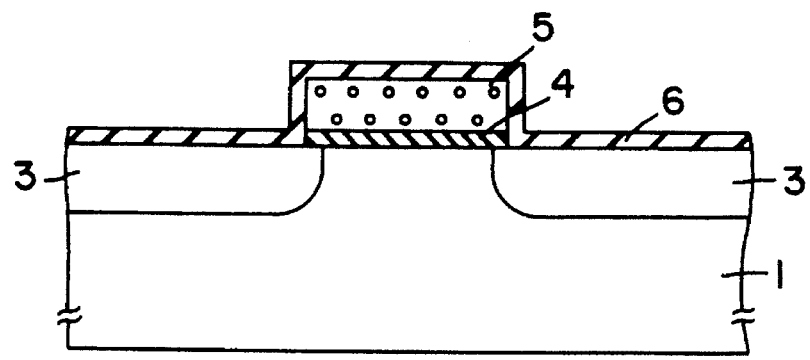
FIG. 4A–4C are process cross-sections of a second embodiment of a MOS semiconductor device fabricating method of this invention.
Figure 4B:
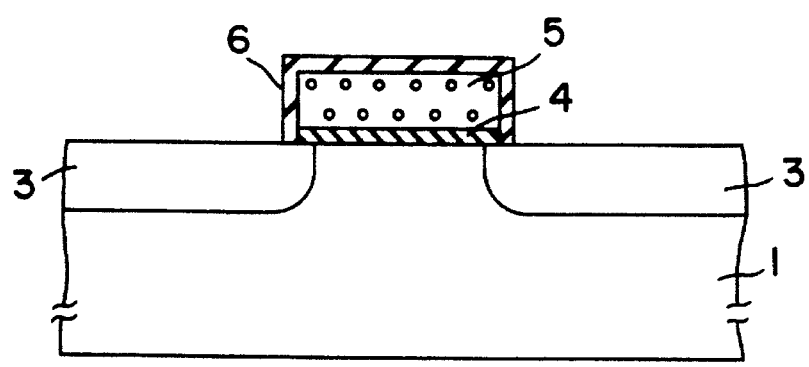
Figure 4C:
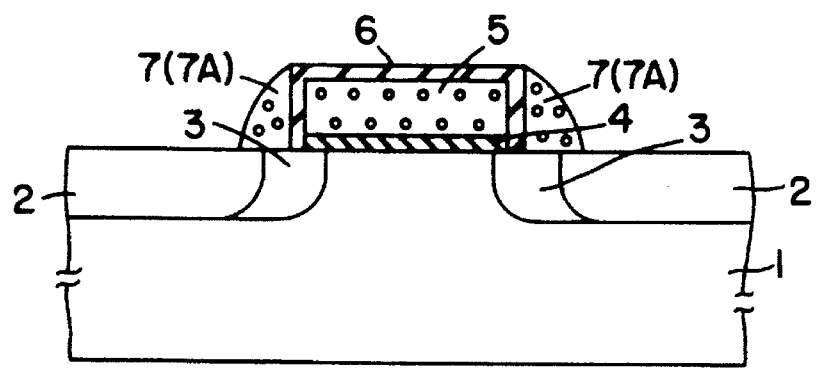

FIG. 4A–4C are process cross-sections of a second embodiment of the MOS semiconductor device fabrication method of the subject invention. In FIG. 4A–4C, 1 is the first conductivity type semiconductor substrate (p type), 2 is the second conductivity type high concentration source-drain diffusion layer in (n+ type), 3 is the second conductivity type low concentration diffusion layer in (n–type), 4 is the gate oxide film, 5 is the gate electrode, 6 is the insulating film, 7 is the polycrystalline silicon, and, 7A is the second conductivity type diffusion layer (n type).

As shown in FIG. 4A, the difference from the fabricating method shown in FIG. 3A–3D is that after forming the low concentration diffusion layer 3 on the surface of the semiconductor substrate 1 using the gate electrode 5 as the mask, the insulating film 6 (for example an oxide film) is formed overlaying the surface of the semiconductor substrate 1.

After this, as shown in FIG. 4b, the insulating film 6 is dry etched to remove the insulating film 6 from other than above the gate electrode and the sides of the gate electrode.

Thus, as shown in FIG. 4C, polycrystalline silicon 7 is formed on the sides of the gate electrode 5. Through ion implantation and thermal processing, the high concentration source-drain diffusion layer 2 and the second conductivity type diffusion layer 7A are formed in the same manner as in the above noted embodiment, and the MOS semiconductor device is obtained.

In the subject embodiment, by forming the insulating film by overlaying, a highly voltage resistant insulating film 6 can be obtained, which cannot be obtained in a thermally oxidized film formed over polycrystalline silicon through thermal oxidation. Thus, an extremely reliable MOS semiconductor device is obtained.

Next, with respect to a third embodiment of the MOS semiconductor device fabrication method for manufacturing a MOS semiconductor device, the key points will be explained using the figures.

FIG. 5A–5F are process cross-sections of a third embodiment of the MOS semiconductor device fabrication method of the subject invention. In FIG. 5A– 5F, 1 is the first conductivity type semiconductor substrate (p type), 2 is the second conductivity type high concentration source-drain diffusion layer (n+ type), 3 is the second conductivity type low concentration diffusion layer (n–type), 4 is the gate oxide film, 5 is the gate electrode, 6 is the insulating film, 7 is the polycrystalline silicon, 7A is the second conductivity type diffusion layer (n type), 8 is the insulating film, 9 is the polycrystalline silicon, and 10 is the high concentration polycrystalline silicon.

Figure 5A:
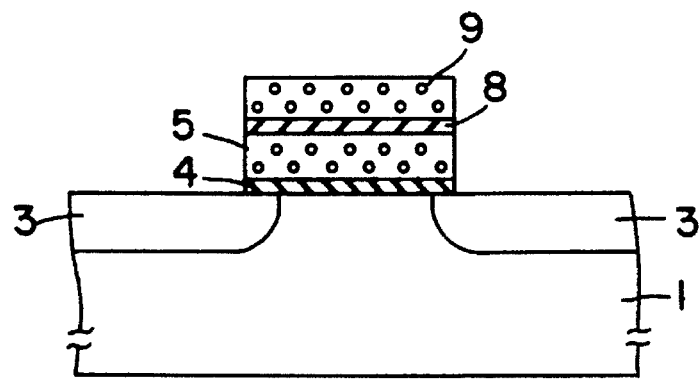
FIG. 5A–5F are process cross-sections of a third embodiment of a MOS semiconductor device fabricating method of this invention.

First, as shown in FIG. 5A, using as the mask the gate electrode 5 formed of polycrystalline silicon via the medium of the gate oxide film 4, and the high concentration polycrystalline silicon 9 formed above the gate electrode 5 via the medium of the insulating film 8, the phosphorus dopant for forming the low concentration diffusion layer (n–type) is ion implanted with an acceleration voltage of 40 keV and a dosage of $1.0 \times 10^{13}$ /cm$^2$. At this time, since ion implantation is conducted using the gate electrode 5 and polycrystalline silicon 7 as the mask, the amount of penetration by the low concentration diffusion layer 3 below the gate electrode 5 is extremely low, and, the effective channel length and the length of the gate will be roughly equal.

Figure 5B:
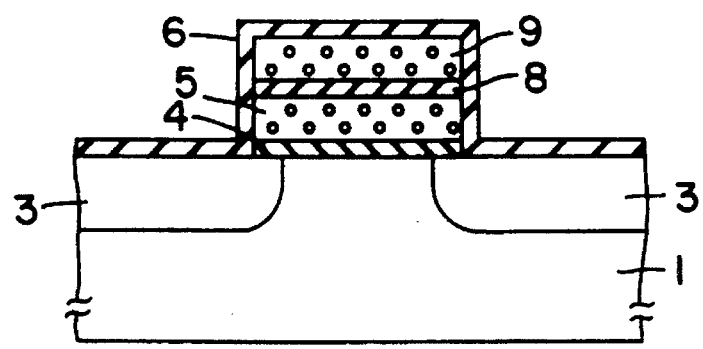

Next, as shown in FIG. 5B, through thermal oxidation, a thermally oxidized insulating film 6 is formed on the surface of the semiconductor substrate 1, and, on the sides and over the gate electrode 5. At this time, since the gate electrode 5 is doped to a high concentration, the insulating film 6 will be formed thicker on the sides of and above the gate electrode 5 than over the surface of the semiconductor substrate 1.

Figure 5C:
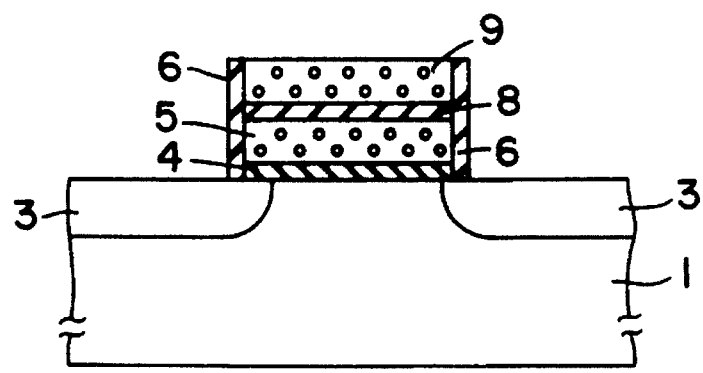

Subsequently, as shown in FIG. 5C, the oxide film 6 is dry etched to remove the oxide film from other than the sides of the gate electrode 5 and the sides of polycrystalline silicon 9, leaving a thin insulating film 6 on the sides of the gate electrode 5 and polycrystalline silicon 9.

Figure 5D:
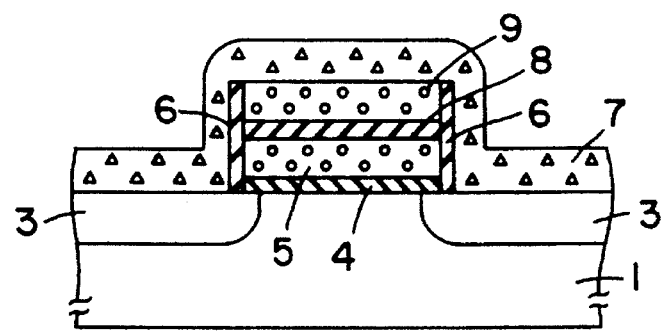

Then, as shown in FIG. 5D, polycrystalline silicon 7 is overlayed on the surface of the semiconductor substrate 1.

Figure 5E:
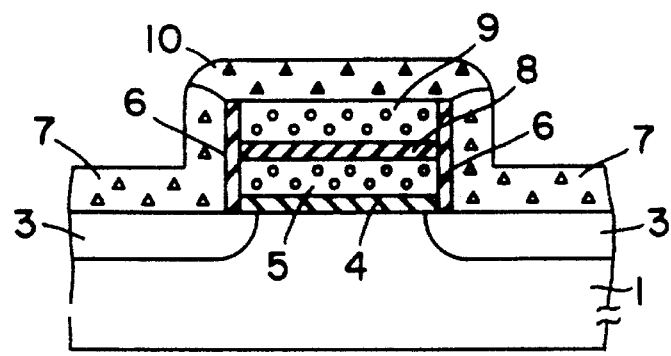

Then, as shown in FIG. 5E, a dopant is diffused into polycrystalline silicon 7 by a thermal diffusion process from a high concentration polycrystalline silicon 9 to form a high concentration polycrystalline silicon 10 above the high concentration polycrystalline silicon 9.

Figure 5F:
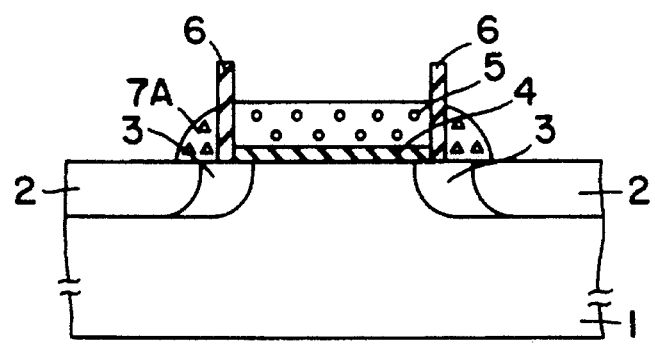
Figure 6:
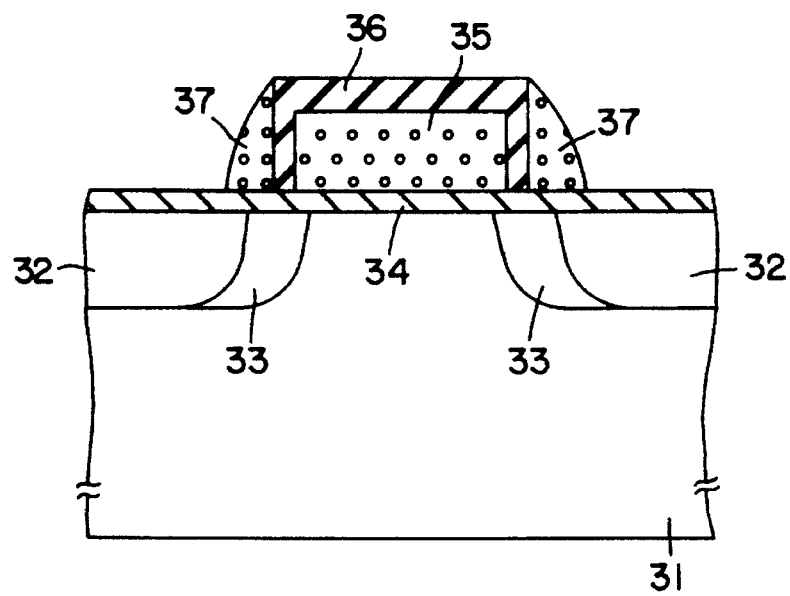
FIG. 6 is a cross-section of a prior art MOS semiconductor device.
Figure 7:
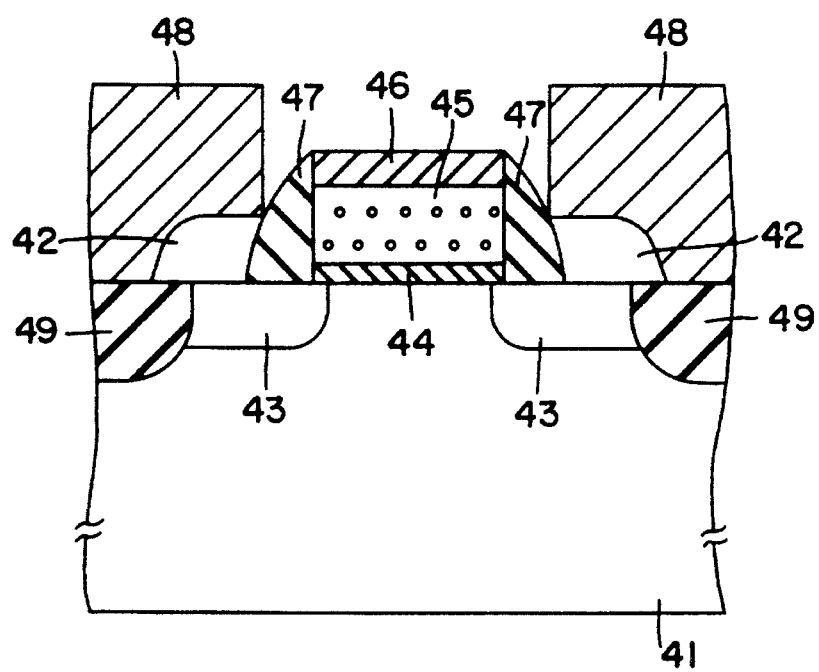
FIG. 7 is a cross-section of another prior art MOS semiconductor device.

Then, as shown in FIG. 5F, etching is used to remove the high concentration polycrystalline silicon 10, and at the same time polycrystalline silicon 7 is left to cover the sides of the gate electrode 5. At this point, both the high concentration polycrystalline silicon 9 and the high concentration polycrystalline silicon 10 formed above it have a high dopant concentration so that they are readily removed by etching.

Again, using the gate electrode 5 and polycrystalline silicon 7 as the mask, Arsenic which is the dopant for forming the high concentration source-drain diffusion layer 2 is ion implanted into the semiconductor substrate 1 with an acceleration voltage of 80 keV and dosage of $6.0 \times 10^{15}$/cm$^2$, and thermally processed to form high concentration source-drain diffusion layer 2 on both sides of the low concentration diffusion layer 3. At the same time, the polycrystalline silicon 7 on both sides of the gate electrode 5 is made into the second conductivity type diffusion layer 7A to obtain the MOS semiconductor device.

At this time, the natural oxide film existing between the polycrystalline silicon 7 and the semiconductor substrate 1 is destroyed by ion implantation, and the low concentration diffusion layer 3 and the diffusion layer 7A are in contact electrically. Also, since polycrystalline silicon 7 is formed self-aligningly, the contact position of the source-drain diffusion layer 2 and the diffusion layer 7A, as well as the amount of overlay between the diffusion layer 7A and the low concentration diffusion layer 3 can be fixed.

As above, in accordance with the subject embodiment, a MOS semiconductor device with roughly equal effective channel length and gate length is readily obtained, and it is possible to miniaturize to the sub-micron region or less. Moreover, since the insulating film 6 is thermally formed between the gate electrode 5 and its sidewall polycrystalline silicon 7, a high precision thin insulating film 6 is readily obtained, process-wise. Also, as polycrystalline silicon 7 is formed self-aligningly, the contact positions between the source-drain diffusion layer 2 and diffusion layer 7A, and, the amount of overlap between the diffusion layer 7A and low concentration diffusion layer 3 can be fixed so that an extremely high-precision high-density MOS semiconductor device can be obtained.

Further, it is obvious that even with respect to a MOS semiconductor device having a low concentration diffusion layer 7B, such a device can be fabricated using the above related fabrication methods. Also, while in the above noted embodiment, the second conductivity type was n type, we can naturally consider an embodiment having a reverse conductivity type.

According to the MOS semiconductor device of the subject invention, a structure having a roughly equal effective channel length and length of the gate can be obtained, making possible miniaturization to the sub-micron region or less.

Again, by forming a second conductivity type diffusion layer on the sides of the gate electrode via the medium of the thin insulating film, it is possible to readily control the potential of the diffusion layer with the gate electrode, promote carrier accumulation of the diffusion layer, effectively reduce the source resistance, and, achieve improved driving capabilities.

Furthermore, by forming the second conductivity type diffusion layer above the second conductivity type low concentration diffusion layer on the sides of the gate electrode via the medium of the thin insulating film, so as to contact this second conductivity type low concentration diffusion layer, the high electrical field within the low concentration diffusion layer can be efficiently ameliorated and the generation of hot carriers can be suppressed. Accordingly, the degradation of electrical characteristics due to hot carriers is ameliorated and reliability can be improved.

Thus, by forming above the low concentration diffusion layer and the second conductivity type diffusion layer contacting the second conductivity type low concentration diffusion layer on the sides of the gate electrode via the medium of the thin insulating film, it is possible to miniaturize the source-drain region.

In particular, by forming the second conductivity type diffusion layer with low concentration, the voltage applied to the insulating film, existing between the gate electrode and the second conductivity diffusion layer, can be reduced and reliability can be greatly improved..

Also according to the MOS semiconductor device fabrication method of the subject invention, it is possible to achieve extreme high-precision and high-density.

That is to say, by ion implanting the dopant for forming the second conductivity type low concentration diffusion layer using the gate electrode as the mask, it is possible to make the effective channel length roughly equal in length to the length of the gate, making it possible to miniaturize to the sub-micron region and less, to form high density VLSI. Also, since the second conductivity type diffusion layer is formed self-aligningly on the sidewalls of the gate electrode through the medium of the insulating film, it is possible to fix contact positions of the second conductivity type diffusion layer and the high concentration source-drain diffusion layer, and, the amount of overlay between the second conductivity type diffusion layer and the low concentration diffusion layer.

Furthermore, in the process of ion implanting the dopant to form the second conductivity type diffusion layer on the sides of the gate electrode, at the same time as forming the second conductivity type diffusion layer it is possible to effectively destroy the oxide film formed between the low concentration diffusion layer and the second conductivity type diffusion layer.

Also, since the second conductivity type diffusion layer contacting the low concentration diffusion layer is formed on the sides of the gate electrode through the medium of the insulating film, it is easy to obtain contacts for the source-drain electrodes, it is easy to miniaturize the source-drain region, and, high density ULSI can be formed.

Particularly, if the insulating film is formed by overlaying, it is possible to form an insulating film with high resistance to voltage.

As related above, the MOS semiconductor device obtained through the subject invention is a sine qua non for the high integration technology having high resistance to hot carrier degradation demanded by VLSI technology for the sub-micron region and less, and it has an extremely high industrial value.

What is claimed:

1. A method of fabricating a MOS semiconductor device comprising:

forming a gate insulating film on a surface of a semiconductor substrate of a first conductivity type, selectively forming a gate electrode above the gate insulating film, the gate electrode having two side, and ion implanting a low concentration diffusion region of a second conductivity type into the surface of the semiconductor substrate using the gate electrode as a mask;

oxidizing the surface of the semiconductor substrate to form an oxide film on the surface of the semiconductor substrate and the sides of the gate electrodes;

completely removing, by dry etching, the oxide film formed on the surface of the semiconductor substrate and from other than above and on the two sides of the gate electrode;

depositing a polycrystalline silicon film over the surface of the semiconductor substrate, wherein the oxide film is retained above and on the two sides of the gate electrode;

dry etching the polycrystalline silicon film to leave the polycrystalline silicon film self-aligned with the gate electrode and covering the two sides of the gate electrode;

ion implanting a dopant of the second conductivity type into the surface of the semiconductor substrate in order to diffuse the dopant into the polycrystalline silicon film remaining on the sides of the gate electrode, to form two sidewall diffusion regions of the second conductivity type on the respective sides of the gate electrode; and forming in the low concentration diffusion region, a high concentration source-drain diffusion region.

2. A method of fabricating a MOS semiconductor device comprising:

forming a gate insulating film on a surface of a semiconductor substrate of a first conductivity type, selectively forming a gate electrode above the gate insulating film, the gate electrode having two sides, ion implanting into the surface of the semiconductor substrate, using the gate electrode as a mask, to form a low concentration diffusion region of a second conductivity type;

depositing an insulating film on the surface of the semiconductor substrate and on two sides of the gate electrode;

completely removing, by dry etching, the insulating film formed on the surface of the semiconductor substrate and from other than above and on the two sides of the gate electrode;

depositing a polycrystalline silicon film on the surface of the semiconductor substrate, wherein the insulating film is retained above and on the two sides of the gate electrode;

dry etching the polycrystalline silicon film to leave the polycrystalline silicon film self-aligned with the gate electrode and covering the two sides of the gate electrode;

ion implanting a dopant of the second conductivity type into the surface of the semiconductor substrate to form two sidewall diffusion regions of the second conductivity type on the respective sides of the gate electrode by diffusing the dopant into the polycrystalline silicon film remaining on the sides of the gate electrode; and, forming a high concentration source-drain region in the low concentration diffusion region.

3. A method of fabricating a MOS semiconductor device comprising:

forming a gate electrode on a surface of a semiconductor substrate of a first conductivity type, through a gate oxide film, and forming a high concentration first polycrystalline silicon film above the gate electrode through a first insulating film, the gate electrode having two sides;

forming by ion implantation a low concentration diffusion region of a second conductivity type on the surface of the semiconductor substrate, using the high concentration first polycrystalline silicon film as a mask;

forming a second insulating film over the surface of the semiconductor substrate;

dry etching the second insulating film to leave the second insulating film covering only the gate electrode and the two sides of the gate electrode, wherein the high concentration first polycrystalline silicon film is retained above the gate electrode;

depositing a second polycrystalline silicon film over the surface of the semiconductor substrate and diffusing a plurality of doping atoms, by thermal treatment, from the high concentration first polycrystalline silicon film to the said second polycrystalline silicon film;

dry etching the second polycrystalline silicon film and the high concentration first polycrystalline silicon film, retaining the second polycrystalline silicon film on the two sides of the gate electrode;

ion implanting a second conductivity type dopant into the surface of the semiconductor substrate to form two sidewall diffusion regions on the respective sides of the gate electrode by diffusing the second conductivity type dopant into the second polycrystalline silicon film remaining on the two sides of the gate electrode; and forming a high concentration source-drain region in the low concentration diffusion region.

* * * * *

UNITED STATES PATENT AND TRADE MARK OFFICE
CERTIFICATE OF CORRECTION

PATENT NO.   : 5,518,944
DATED        : May 21, 1996
INVENTOR(S)  : Hiroki et al.

It is certified that error appears in the above-identified patent and that said Letters Patent is hereby corrected as shown below:

On the cover page, item [57] Abstract, line 20, delete "typetype" and insert --type--.

Signed and Sealed this

Twenty-second Day of October, 1996

Attest:

BRUCE LEHMAN

*Attesting Officer*        Commissioner of Patents and Trademarks